United States Patent
Lei et al.

(10) Patent No.: US 9,620,379 B2
(45) Date of Patent: *Apr. 11, 2017

(54) MULTI-LAYER MASK INCLUDING NON-PHOTODEFINABLE LASER ENERGY ABSORBING LAYER FOR SUBSTRATE DICING BY LASER AND PLASMA ETCH

(71) Applicant: APPLIED MATERIALS, INC., Santa Clara, CA (US)

(72) Inventors: Wei-Sheng Lei, San Jose, CA (US); Mohammad Kamruzzaman Chowdhury, Santa Clara, CA (US); Todd Egan, Fremont, CA (US); Brad Eaton, Menlo Park, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/775,651

(22) PCT Filed: Mar. 11, 2014

(86) PCT No.: PCT/US2014/023767
§ 371 (c)(1),
(2) Date: Sep. 11, 2015

(87) PCT Pub. No.: WO2014/159464
PCT Pub. Date: Oct. 2, 2014

(65) Prior Publication Data
US 2016/0035577 A1 Feb. 4, 2016

Related U.S. Application Data

(60) Provisional application No. 61/784,621, filed on Mar. 14, 2013.

(51) Int. Cl.
*H01L 21/67* (2006.01)
*H01L 21/78* (2006.01)
(Continued)

(52) U.S. Cl.
CPC ........ *H01L 21/3086* (2013.01); *B23K 26/364* (2015.10); *B23K 26/40* (2013.01);
(Continued)

(58) Field of Classification Search
None
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Linder, "Water—Soluble Sacrificial Layers for Surface Micromachining", Small, vol. 1 No. 7 (Jul. 2005): 730-736.*

(Continued)

*Primary Examiner* — Asok K Sarkar
(74) *Attorney, Agent, or Firm* — Blakely Sokoloff Taylor Zafman LLP

(57) ABSTRACT

Methods of dicing substrates having a plurality of ICs. A method includes forming a multi-layered mask comprising a laser energy absorbing, non-photodefinable topcoat disposed over a water-soluble base layer disposed over the semiconductor substrate. Because the laser light absorbing material layer is non-photodefinable, material costs associated with conventional photo resist formulations may be avoided. The (Continued)

mask is direct-write patterned with a laser scribing process to provide a patterned mask with gaps. The patterning exposes regions of the substrate between the ICs. Absorption of the mask layer within the laser emission band (e.g., UV band and/or green band) promotes good scribe line quality. The substrate may then be plasma etched through the gaps in the patterned mask to singulate the IC with the mask protecting the ICs during the plasma etch. The soluble base layer of the mask may then be dissolved subsequent to singulation, facilitating removal of the layer.

10 Claims, 9 Drawing Sheets

(51) Int. Cl.
    *H01L 21/308* (2006.01)
    *H01L 21/3065* (2006.01)
    *B23K 26/364* (2014.01)
    *B23K 26/40* (2014.01)
    *B23K 26/402* (2014.01)
    *H01L 21/673* (2006.01)
    *H01L 21/687* (2006.01)
    *H01L 21/82* (2006.01)
    *B23K 103/16* (2006.01)
    *B23K 103/00* (2006.01)

(52) U.S. Cl.
    CPC ........ *B23K 26/402* (2013.01); *H01L 21/3065* (2013.01); *H01L 21/3081* (2013.01); *H01L 21/3085* (2013.01); *H01L 21/30655* (2013.01); *H01L 21/67069* (2013.01); *H01L 21/67196* (2013.01); *H01L 21/67207* (2013.01); *H01L 21/67383* (2013.01); *H01L 21/68707* (2013.01); *H01L 21/78* (2013.01); *H01L 21/82* (2013.01); *B23K 2203/172* (2015.10); *B23K 2203/56* (2015.10)

(56) References Cited

U.S. PATENT DOCUMENTS

| | | | |
|---|---|---|---|
| 4,684,437 A | | 8/1987 | Donelon et al. |
| 5,336,638 A | | 8/1994 | Suzuki et al. |
| 5,593,606 A | | 1/1997 | Owen et al. |
| 5,691,794 A | | 11/1997 | Hoshi et al. |
| 6,051,503 A | | 4/2000 | Bhardwaj et al. |
| 6,057,180 A | | 5/2000 | Sun et al. |
| 6,117,347 A | * | 9/2000 | Ishida ................ H01L 21/3043 216/17 |
| 6,174,271 B1 | | 1/2001 | Kosmowski |
| 6,300,593 B1 | | 10/2001 | Poweli |
| 6,306,731 B1 | | 10/2001 | Igarashi et al. |
| 6,407,363 B2 | | 6/2002 | Dunsky et al. |
| 6,426,275 B1 | | 7/2002 | Arisa |
| 6,465,158 B1 | | 10/2002 | Sekiya |
| 6,528,864 B1 | | 3/2003 | Arai |
| 6,574,250 B2 | | 6/2003 | Sun et al. |
| 6,582,983 B1 | | 6/2003 | Runyon et al. |
| 6,593,542 B2 | | 7/2003 | Baird et al. |
| 6,642,127 B2 | | 11/2003 | Kumar et al. |
| 6,676,878 B2 | | 1/2004 | O'Brien et al. |
| 6,696,669 B2 | | 2/2004 | Hembree et al. |
| 6,706,998 B2 | | 3/2004 | Cutler |
| 6,759,275 B1 | | 7/2004 | Lee et al. |
| 6,803,247 B2 | | 10/2004 | Sekiya |
| 6,887,804 B2 | | 5/2005 | Sun et al. |
| 6,998,571 B2 | | 2/2006 | Sekiya et al. |
| 7,128,806 B2 | | 10/2006 | Nguyen et al. |
| 7,129,150 B2 | | 10/2006 | Kawai |
| 7,179,723 B2 | | 2/2007 | Genda et al. |
| 7,265,033 B2 | | 9/2007 | Shigematsu et al. |
| 7,361,990 B2 | | 4/2008 | Lu et al. |
| 7,364,986 B2 | | 4/2008 | Nagai et al. |
| 7,435,607 B2 | | 10/2008 | Nagai |
| 7,459,377 B2 | | 12/2008 | Ueda et al. |
| 7,468,309 B2 | | 12/2008 | Shigematsu et al. |
| 7,473,866 B2 | | 1/2009 | Morishige et al. |
| 7,507,638 B2 | | 3/2009 | Mancini et al. |
| 7,507,639 B2 | | 3/2009 | Nakamura |
| 7,629,228 B2 | | 12/2009 | Haji et al. |
| 7,678,670 B2 | | 3/2010 | Arita et al. |
| 7,687,740 B2 | | 3/2010 | Bruland et al. |
| 7,754,584 B2 | | 7/2010 | Kumakawa |
| 7,767,551 B2 | | 8/2010 | Arita et al. |
| 7,767,554 B2 | | 8/2010 | Arita et al. |
| 7,776,720 B2 | | 8/2010 | Boyle et al. |
| 7,804,043 B2 | | 9/2010 | Deshi |
| 7,838,323 B2 | | 11/2010 | Utsumi et al. |
| 7,859,084 B2 | | 12/2010 | Utsumi et al. |
| 7,875,898 B2 | | 1/2011 | Maeda |
| 7,906,410 B2 | | 3/2011 | Arita et al. |
| 7,923,351 B2 | | 4/2011 | Arita |
| 7,926,410 B2 | | 4/2011 | Bair |
| 7,927,973 B2 | | 4/2011 | Haji et al. |
| 8,507,363 B2 | * | 8/2013 | Lei .................. H01L 21/78 257/E21.602 |
| 8,557,682 B2 | * | 10/2013 | Holden .................. H01L 21/78 257/E21.599 |
| 8,598,016 B2 | * | 12/2013 | Yalamanchili .... H01L 21/30655 257/E21.602 |
| 8,703,581 B2 | * | 4/2014 | Lei .................. H01L 21/78 438/462 |
| 8,845,854 B2 | * | 9/2014 | Lei .................. H01L 21/78 118/719 |
| 8,859,397 B2 | * | 10/2014 | Lei .................. H01L 21/78 438/462 |
| 8,883,615 B1 | * | 11/2014 | Holden ............... H01L 21/3081 257/723 |
| 8,912,078 B1 | * | 12/2014 | Lei .................. H01L 21/78 257/E21.001 |
| 9,048,309 B2 | * | 6/2015 | Chowdhury ............ H01L 21/78 |
| 2003/0162313 A1 | | 8/2003 | Kim et al. |
| 2004/0080045 A1 | | 4/2004 | Kimura et al. |
| 2004/0137700 A1 | | 7/2004 | Sekiya |
| 2004/0157457 A1 | | 8/2004 | Xu et al. |
| 2004/0212047 A1 | | 10/2004 | Joshi et al. |
| 2005/0106782 A1 | | 5/2005 | Genda et al. |
| 2006/0003551 A1 | * | 1/2006 | Mancini .............. H01L 21/3065 438/462 |
| 2006/0043535 A1 | | 3/2006 | Hiatt |
| 2006/0086898 A1 | | 4/2006 | Cheng et al. |
| 2006/0088984 A1 | | 4/2006 | Li et al. |
| 2006/0146910 A1 | | 7/2006 | Koochesfahani et al. |
| 2006/0205182 A1 | | 9/2006 | Soejima |
| 2009/0255911 A1 | | 10/2009 | Krishnaswami et al. |
| 2010/0013036 A1 | | 1/2010 | Carey |
| 2010/0216313 A1 | | 8/2010 | Iwai et al. |
| 2010/0248451 A1 | | 9/2010 | Pirogovsky et al. |
| 2010/0304551 A1 | | 12/2010 | Takanashi et al. |
| 2011/0014777 A1 | | 1/2011 | Haji et al. |
| 2011/0312157 A1 | | 12/2011 | Lei et al. |
| 2012/0322241 A1 | | 12/2012 | Holden et al. |
| 2013/0045554 A1 | | 2/2013 | Yamazaki |
| 2013/0065378 A1 | | 3/2013 | Johnson et al. |
| 2013/0230972 A1 | | 9/2013 | Johnson et al. |
| 2015/0196972 A1 | * | 7/2015 | Wohl, Jr. ........... B23K 26/0081 428/687 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

(56) References Cited

FOREIGN PATENT DOCUMENTS

OTHER PUBLICATIONS

The PCT Search Report and Written Opinion mailed on Jun. 26, 2014 in related matter (PCT/US2014/023767), 12 pages total.
Linder, V. et al., "Water-Soluble Sacrificial Layers for Surface Micromachining," www.small-journal.com, 2005, 1, No. 7, 7 pgs.
Singh, Saravjeet et al., "Apparatus and Methods for Dry Etch With Edge, Side and Back Protection," U.S. Appl. No. 61/491,693, filed May 31, 2011 24 pgs.
International Preliminary Report on Patentability for Application No. PCT/US2014/023767, issued Sep. 15, 2015, 8 pages.

* cited by examiner

MULTI-LAYER MASK INCLUDING NON-PHOTODEFINABLE LASER ENERGY ABSORBING LAYER FOR SUBSTRATE DICING BY LASER AND PLASMA ETCH

PRIORITY

This patent application is a U.S. National Phase Application under 35 U.S.C. §371 of International Application No. PCT/US2014/023767, filed on Mar. 11, 2014, entitled MULTI-LAYER MASK INCLUDING NON-PHOTODEFINABLE LASER ENERGY ABSORBING LAYER FOR SUBSTRATE DICING BY LASER AND PLASMA ETCH, which claims the priority to the U.S. Provisional Patent Application No. 61/784,621 filed Mar. 14, 2013.

TECHNICAL FIELD

Embodiments of the present invention pertain to the field of semiconductor processing and, in particular, to masking methods for dicing substrates, each substrate having an integrated circuit (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting, or insulating are utilized to form the ICs. These materials are doped, deposited and etched using various well-known processes to simultaneously form a plurality of ICs, such as memory devices, logic devices, photovoltaic devices, etc., in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the streets. For thin substrate singulation, such as <150 μm thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered metals (e.g., copper) in dicing along streets can create product issues or throughput limits. Finally, masking of the plasma dicing process may be problematic, depending on, inter alia, the thickness and top surface topography of the substrate, the selectivity of the plasma etch, and removal of the mask selectively from the materials present on the top surface of the substrate.

SUMMARY

Embodiments of the present invention include methods of masking semiconductor substrates for a laser dicing or hybrid dicing process including both laser scribing and plasma etching.

In an embodiment, a method of dicing a semiconductor substrate having a plurality of ICs includes forming a non-photodefinable laser light absorbing mask over the semiconductor substrate. In exemplary embodiments, the mask includes a plurality of distinct material layers covering and protecting the IC with a base layer that is water-soluble to facilitate easy removal of the mask following the dicing process. The mask is patterned with a laser scribing process to provide a patterned mask with gaps, exposing regions of the substrate between the ICs. The substrate may then be plasma etched through the gaps in the patterned mask to singulate the ICs into chips.

In another embodiment, a system for dicing a semiconductor substrate includes a femtosecond laser; a plasma etch chamber, and a mask deposition module, coupled to a same platform.

In another embodiment, a method of dicing a substrate having a plurality of ICs includes forming a multi-layered mask, including a non-photosensitive laser light absorbing layer, over a front side of a silicon substrate. The ICs include a copper bumped top surface having bumps surrounded by a passivation layer, such as polyimide (PI). Subsurface thin films below the bumps and passivation include a low-K interlayer dielectric (ILD) layer and a layer of copper interconnect. The multi-layered mask, being UV-curable, for example, is absorbing within the bandwidth of the laser emission employed for scribing, which improves laser-scribed edge quality as the passivation layer, and subsurface thin films are patterned with a laser scribing process (e.g., femtosecond laser) to expose regions of the silicon substrate between the ICs. The silicon substrate is etched through the gaps with a deep silicon plasma etch process to singulate the ICs and the multi-layered mask, which may remain substantially uncured in regions not laser ablated is then wet processed to dissolve the material off of the passivation layer.

According to one embodiment, a semiconductor wafer includes a plurality of integrated circuits (ICs) disposed on a substrate, and a multi-layered mask including a water-soluble base layer and a non-photodefinable laser light absorbing overcoat disposed over thin film layers of the ICs. The mask is ablated in regions disposed over streets between adjacent ICs. In one such embodiment, the semiconductor wafer may be further processed to singulate the ICs, such as with a plasma etch process.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
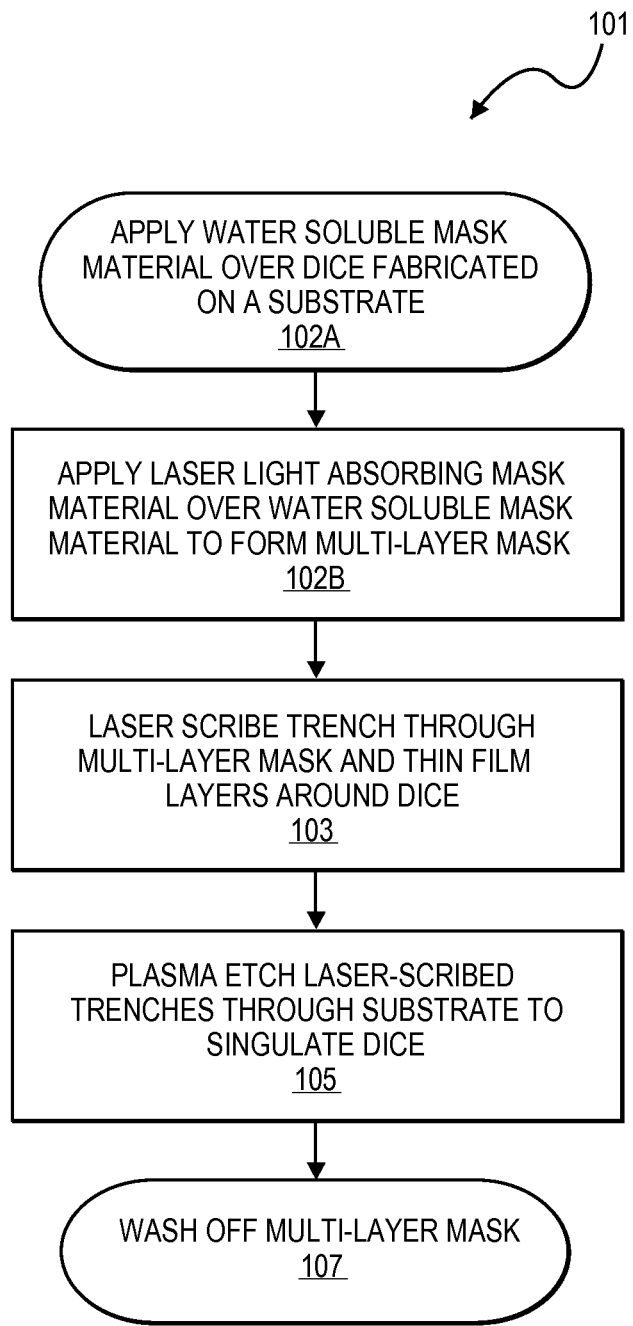
FIG. 1A is a flow diagram illustrating a hybrid laser ablation-plasma etch singulation method employing a multi-layered mask including a non-photodefinable laser light absorbing layer, in accordance with an embodiment of the present invention.

Methods and apparatuses for dicing substrates are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, a substrate dicing process involving at least an initial laser scribe and potentially a subsequent plasma etch is implemented with a multi-layered mask including a non-photodefinable laser light absorbing layer for die singulation. The laser scribe process may be used to cleanly remove an unpatterned (e.g., blanket) mask including the laser light absorbing layer and a water-soluble layer, a passivation layer, and subsurface thin film device layers along streets between adjacent ICs. The laser ablation process may then either be terminated upon exposure, partial ablation, or complete ablation of the underlying substrate. Where only partial ablation of substrate is performed (e.g., where the wafer is over 100-150 µm), the plasma etch portion of a hybrid dicing process then etches through the bulk of the substrate, such as through bulk single crystalline silicon, for singulation or dicing of chips.

In accordance with an embodiment of the present invention, a combination of laser scribing and plasma etching is used to dice a semiconductor substrate into individualized or singulated ICs. In one embodiment, femtosecond laser scribing is an essentially, if not completely, a non-equilibrium process. For example, the femtosecond-based laser scribing may be localized with a negligible thermal damage zone. In an embodiment, laser scribing is used to singulate ICs having ultra-low κ films (i.e., with a dielectric constant below 3.0). In one embodiment, direct writing with a laser eliminates a lithography patterning operation, allowing the masking material to be something other than a conventional photo resist as is used in photolithography. In one embodiment, substantially anisotropic etching is used to complete the dicing process in a plasma etch chamber; the anisotropic etch achieving a high directionality into the substrate by depositing an etch polymer on sidewalls of the etched trench.

Figure 1B:
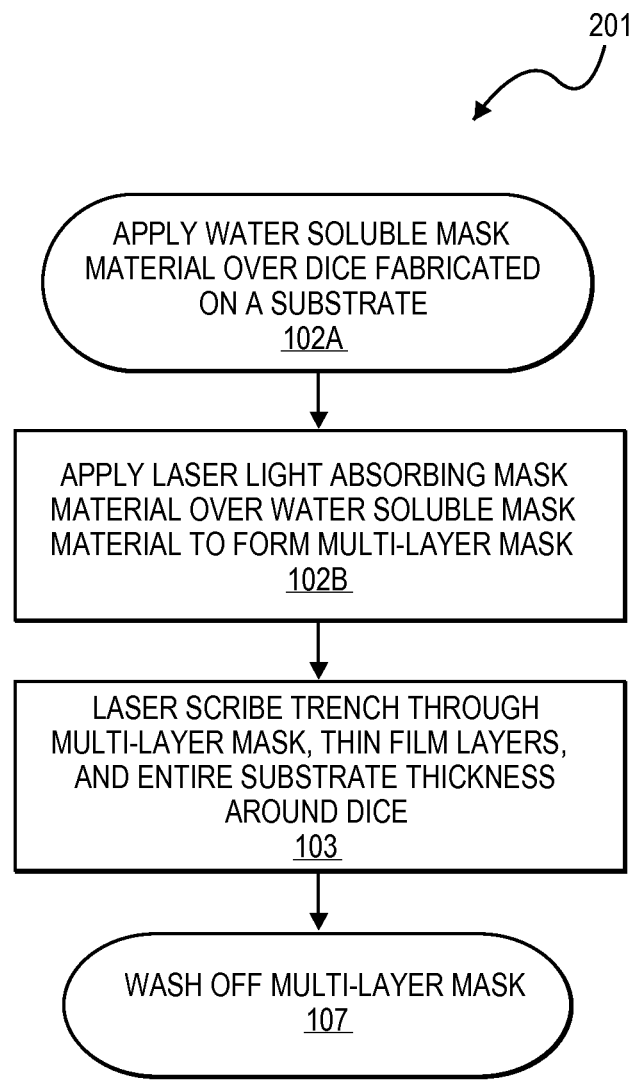
FIG. 1B is a flow diagram illustrating a laser ablation singulation method employing a multi-layered mask including a non-photodefinable laser light absorbing layer, in accordance with an embodiment of the present invention.

FIG. 1A is a flow diagram illustrating a hybrid laser ablation-plasma etch singulation process 101 employing a multi-layered mask including a non-photodefinable laser light absorbing layer, in accordance with an embodiment of the present invention. FIG. 1B is a flow diagram illustrating a laser ablation singulation process 201 employing a multi-layered mask including a non-photodefinable laser light absorbing layer, in accordance with an embodiment of the present invention. FIGS. 4A-4D illustrate cross-sectional views of a substrate 406 including first and second ICs 425, 426 corresponding to the operations in either method 101 or 201, in accordance with embodiments of the present invention.

Figure 2:
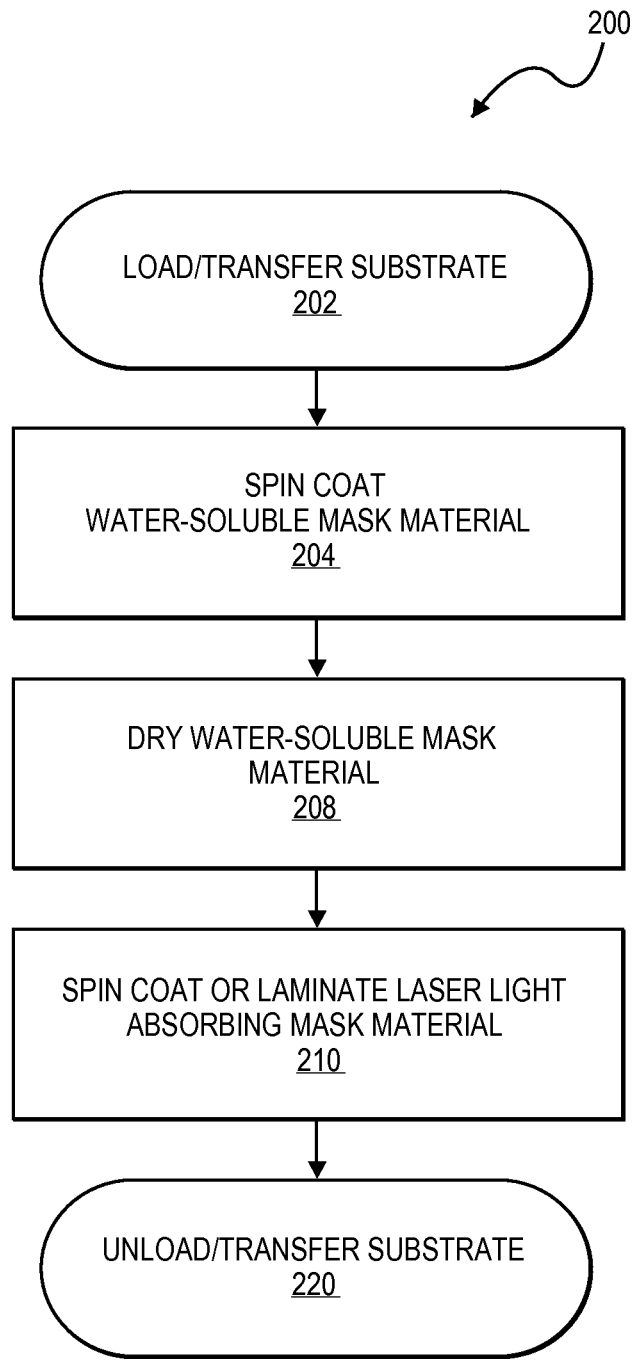
FIG. 2 is a flow diagram illustrating a method of forming a multi-layered mask including a non-photodefinable laser light absorbing layer, in accordance with an embodiment of the present invention.
Figure 4A:
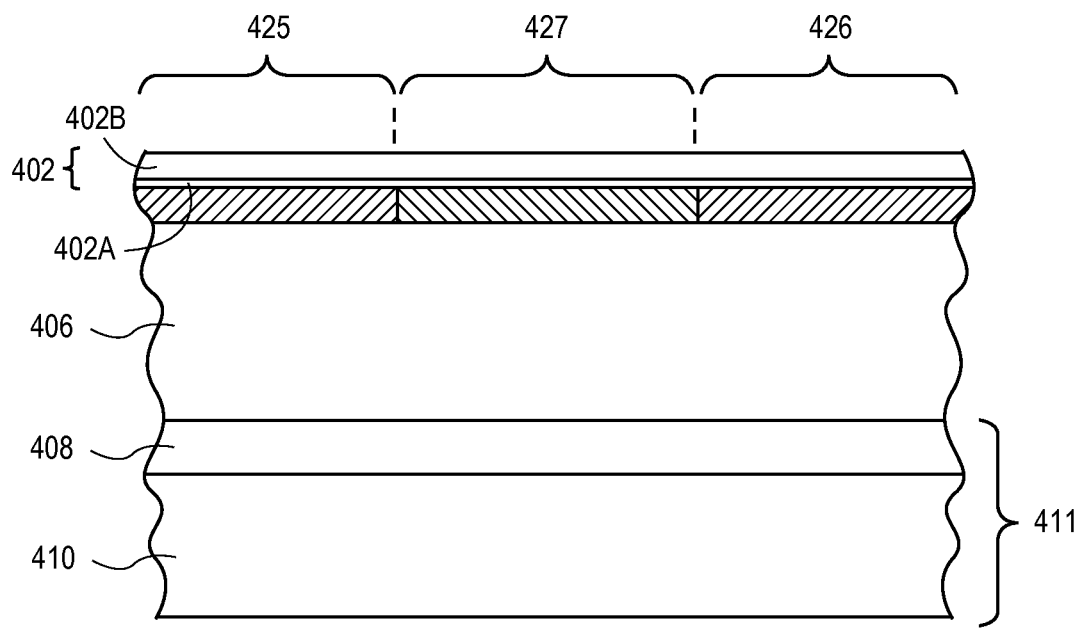
FIG. 4A illustrates a cross-sectional view of a semiconductor substrate including a plurality of ICs corresponding to operations 102A and 102B of the dicing methods illustrated in FIGS. 1A and 1B, in accordance with an embodiment of the present invention.

Referring to operations 102A and 102B of FIGS. 1 and 2, and corresponding FIG. 4A, a multi-layered mask including a non-photodefinable laser light absorbing material layer 402B and a water-soluble material layer 402A is formed above a substrate 406. Generally, the substrate 406 is composed of any material suitable to withstand a fabrication process of the thin film device layers formed thereon. For example, in one embodiment, the substrate 406 is a group IV-based material such as, but not limited to, monocrystalline silicon, germanium or silicon/germanium. In another embodiment, the substrate 406 is a III-V material such as, e.g., a III-V material substrate used in the fabrication of light emitting diodes (LEDs). During device fabrication, the substrate 406 is typically 600 μm-800 μm thick, but as illustrated in FIG. 4A may have been thinned to 100 μm or even to 50 μm with the thinned substrate now supported by a carrier 411, such as a backing tape 410 stretched across a support structure of a dicing frame (not illustrated) and adhered to a backside of the substrate with a die attach film (DAF) 408.

In embodiments, first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. The width of the street 427 may be anywhere between 10 μm and 200 μm, measured at the thin film device layer stack/substrate interface.

In embodiments, the mask 402 includes both a non-photodefinable laser light absorbing polymer layer 402B formed at operation 102B in direct contact with a water-soluble polymer layer 402A formed at operation 102A on a top surface of the ICs 425, 426. For example, the water-soluble polymer may be applied directly on a passivation layer, such as a polyimide (PI) top passivation layer of the ICs 425, 426. The mask 402 also covers the intervening street 427 between the ICs 425, 426. The composition of the mask layer 402B is such that it absorbs energy in the UV band, and may further absorb photon energy within the 300 and 400 nm wavelengths.

Figure 3A:
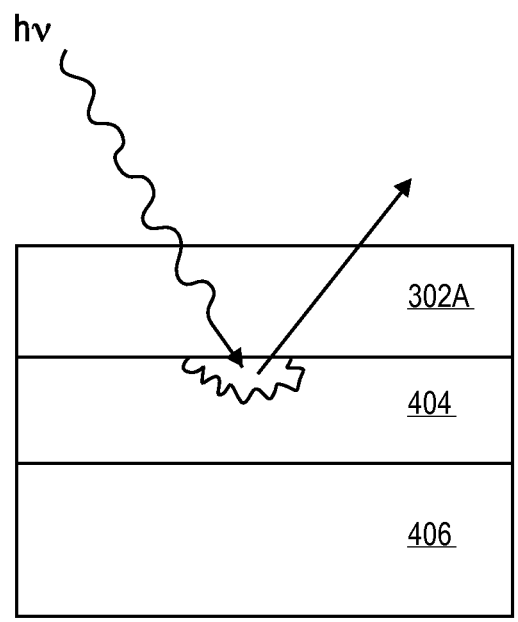
FIGS. 3A and 3B are schematics illustrating differing levels of laser light coupling between a UV transparent mask and a mask including a laser light absorbing layer, in accordance with an embodiment of the present invention.

The mask 402 is unpatterned prior to the laser scribing operation 103 with the laser scribe to perform a direct writing of the scribe lines. As shown in FIG. 3A, where a mask 302A having little absorbance within the laser band (e.g., substantially transparent in the 300-540 nm or 300-1600 nm bands) is disposed over the IC thin film layers 404, the mask 302A may couple very little energy from the laser. Polyvinyl alcohol (PVA), as an exemplary mask material having advantageously high water solubility, is highly transparent in the 350 nm to 800 nm range (i.e., non-laser light absorbing). With most industrial solid state lasers producing photons in the wavelength regime from 250 nm to 1600 nm, a PVA mask passes most laser energy through to the underlying IC thin film layers 404, which having greater absorbance themselves, ablate/vaporize below the surface of the transparent mask. Thus, in FIG. 3A, the thin film IC layer 404 is ablated first, after the laser energy passes through the non-absorbing mask 302A. With the mask 302A unaffected by the laser energy, the mask 302A proximate to the path of the laser is removed as collateral laser scribe damage occurring through secondary, uncontrolled mechanisms which have been found to result in poor quality scribed sidewalls. The inventors have further attributed the rough, fracture sidewalls associated with low mask absorption with low die strength and increased die cracking resulting in potential yield loss.

Figure 3B:
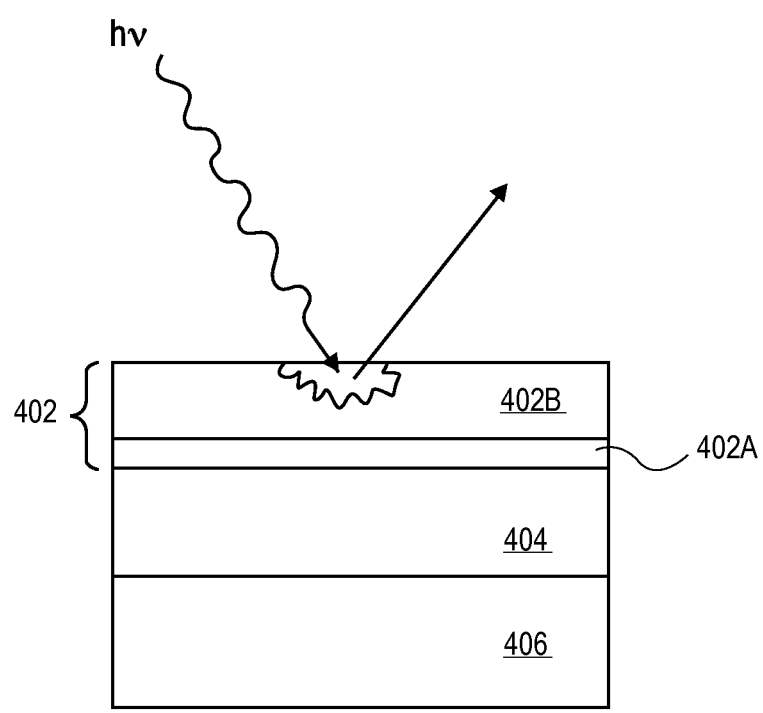

In contrast, as shown in FIG. 3B, where the laser light absorbing multi-layered mask 402 is disposed over the IC thin film layers 404, significant laser energy is coupled from a laser upon exposure and at least the bulk of the mask 402 corresponding to the laser light absorbing layer 402B ablates/vaporizes no later than does the IC film layer 404. Thus, in FIG. 3B, the mask layer 402B is itself ablated without extensive collateral laser scribe damage, and scribe sidewall quality/die strength is improved. Notably, ablation of the mask itself, as a temporary layer disposed above the IC film layer 404, has been found important in the quality of scribe in the IC film layer 404. Not intending to be bound by theory, it is currently understood by the inventors that the mechanical forces associated with collateral damage to the mask layer may permanently impair the structure of the IC film layer 404. With this reasoning, photon absorption in the mask layer 402B is advantageous. The addition of the water-soluble layer 402A, which may be relatively thinner as a mere base layer, facilitates removal of the mask with a water rinse. The mask layer 402B may be chosen freely without constraints related to stripping the material post-scribe selectively to the thin film IC layer 404. Noting further that the laser scribing process is direct-write and the scribe mask is not pre-patterned, for example by a photolithography process, the mask layer 402B may also be chosen without constraints related to photo-sensitivity, and indeed for greatest economy, embodiments herein employ non-photodefinable laser light absorbing polymers for the mask layer 402B. In further embodiments, the mask layer 402B, as a laser light absorbing material is of a composition that further offers some protection to the top surface of the ICs 425, 426 during a hybrid laser ablation-plasma etch singulation process (e.g., the method 101 of FIG. 1A or the method 201 of FIG. 1B).

With the laser light absorbing mask layer 402B being water-soluble, the first mask material layer 402A may function either as a means of undercutting the plasma resistant mask layer so that the plasma resistant layer may be lifted off from the underlying IC thin film layer 404, or as a barrier protecting the IC thin film layer 404 from the process used to strip the laser light absorbing mask layer 402B.

Figure 5:
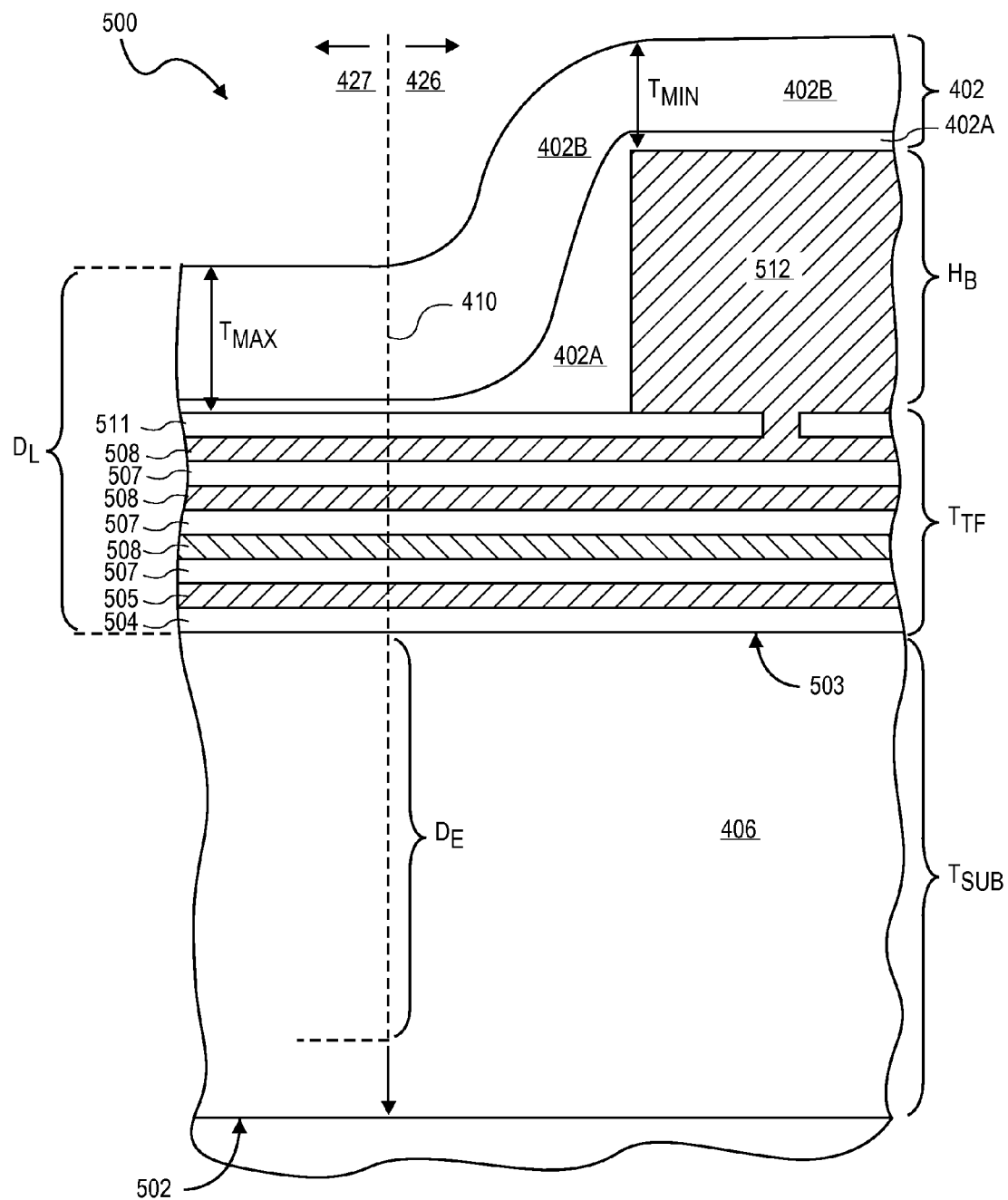
FIG. 5 illustrates a cross-sectional view of a multi-layered mask including a non-photodefinable laser light absorbing layer applied to over a top surface and subsurface thin films of a substrate including a plurality of ICs, in accordance with embodiments of the present invention.

FIG. 5 illustrates an expanded cross-sectional view 500 of one exemplary embodiment including a multi-layered mask including a non-photodefinable laser light absorbing layer 402B disposed over a water-soluble layer 402A that is in contact with a top surface of the IC 426 and the street 427. As shown in FIG. 5, the substrate 406 has a top surface 503 upon which thin film device layers are disposed. The top surface 503 is opposite a bottom surface 502 that interfaces with the DAF 408 (FIG. 4A). Generally, the thin film device layer materials may include, but are not limited to, organic materials (e.g., polymers), metals, or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) 507, such as carbon doped oxide (CDO), disposed there between. A top surface of the IC 426 includes a bump 512, typically copper, surrounded by a passivation layer 511, typically a polyimide (PI) or similar polymer. The bumps 512 and passivation layer 511 therefore make up a top surface of the IC with the thin film device layers forming subsurface IC layers. The bump 512 extends from a top surface of the passivation layer 511 by a bump height $H_B$, which in the exemplary embodiments ranges between 10 μm and 50 μm.

Referring to FIG. 5, in the street, the maximum thickness $T_{max}$ of the laser light absorbing multi-layered mask 402 in the street 427 is generally limited by the ability of a laser to pattern through the mask by ablation. The laser light absorbing multi-layered mask 402 may be much thicker over the ICs 425, 426 and or edges of the street 427 where no street pattern is to be formed. As such, $T_{max}$ is a function of laser power and the optical conversion efficiency associated with laser wavelength. As $T_{max}$ is associated with the street 427, street feature topography, street width, and the method of applying the laser light absorbing multi-layered mask 402 may be designed to limit $T_{max}$ to a thickness which can be ablated along with underlying thin film device layers in one or more laser passes, depending on throughput requirements. In particular embodiments, the laser light absorbing multi-layered mask 402 has a street mask thickness $T_{max}$ which is less than 30 μm and advantageously less than 20 μm with a thicker mask calling for multiple laser passes.

As further shown in FIG. 5, the minimum thickness $T_{min}$ of the laser light absorbing multi-layered mask 402, found on a top surface of the bump 512 (being an extreme of the topography), is a function of the selectivity achieved by the subsequent plasma etch (e.g., operation 105 in FIG. 1A). The plasma etch selectivity is dependent on at least both the material/composition of the laser light absorbing multi-layered mask 402 and the etch process employed.

As oxidative plasma cleans, acidic etchants, and many other conventional mask stripping processes may not be compatible with the bump 512 and/or passivation layer 511, laser light absorbing multi-layered mask 402 is advantageously removable with water. In a further embodiment, the laser light absorbing multi-layered mask 402 is also thermally stable to at least 60° C., preferably stable at 100° C., and ideally stable to 120° C. to avoid excessive crosslinking (i.e., thermal curing) during the subsequent plasma etch process when the material's temperature will be elevated (e.g., through application of plasma power). In alternative embodiments however, thermal curing may be acceptable because depending on the polymers present, crosslinking may either disadvantageously retard stripping of the mask material, or as for some UV curable adhesive films, may advantageously promote stripping by reducing adhesion forces between the mask 402A and the IC thin film layers 404 (e.g., by 80%, or more). Thermal and/or UV curing between laser scribing and mask stripping may therefore make removal of the mask 402A more, or less, difficult.

In embodiments, the first mask material layer 402A is a water-soluble polymer. Selection of water-soluble material for the present invention is complicated by thermal stability requirements, mechanics of applying/removing the material to/from the substrate, and IC contamination concerns. Exemplary water-soluble materials having sufficient thermal stability include any of: poly(vinyl alcohol), poly(acrylic acid), poly(methacrylic acid), poly(acrylamide), poly(ethylene oxide), or the like. For the exemplary embodiment employing PVA, thermal stability has been confirmed for 60° C. with solubility decreasing as the temperature approaches 150° C. As such, for a PVA embodiment, processing after operation 102A until the multi-layered mask 402 is removed (i.e., plasma etching of the street 427) advantageously maintains the first mask layer 402A at a temperature below 150° C., preferably below 100° C., and ideally below 80° C.

In embodiments, the non-photodefinable laser light absorbing layer 402B is a non-water-soluble polymer. Exemplary materials include Poly(methyl methacrylate) (PMMA), Poly(methyl acrylate) (PMA), and Beta-acryloyloxy propionic acid (APA), any of which may be modified to have good absorbance in the 300-400 nm range using techniques known in the polymer arts. In another embodiment, one or more laser light absorbing constituents present in any conventional photoresist composition are employed for the mask layer 402B, but in the absence of any photo acid generator (PAG) such that the material is non-photodefinable/non-photo reactive. In another embodiment, the laser light absorbing layer 402B comprises a polystyene-co-polyacrylonitrile copolymer, and/or an epoxy-containing polymer (e.g., cyanate ester-epoxy, epoxy-phenolic). In still another embodiment, the mask layer 402B comprises one or more polyolefins.

Depending on the embodiment, the first mask material layer 402A is wet applied onto the substrate 406 to cover the passivation layer 511 and bump 512 or applied as a dry film laminate. In a first embodiment, the first mask material layer 402A is merely sprayed onto the substrate. In a further embodiment, the first mask material layer 402A spin coated onto the substrate. FIG. 2 is a flow diagram illustrating a masking method 200 for spin coating the first mask material layer 402A onto a substrate to be diced, in accordance with an embodiment of the present invention. At operation 202, a substrate is loaded onto a spin coat system or transferred into a spin coat module of an integrated platform. At operation 204 a polymeric precursor solution is spun over the passivation layer 511 and bump 512. For the exemplary water soluble first mask material layer, the polymeric precursor solution is an aqueous solution. Experiments conducted with spin-on PVA solutions have demonstrated coverage of bumps with a height ($H_B$) of 50 μm.

At operation 208 the wet coat is dried or baked, for example on a hot plate, and the substrate unloaded for laser scribe or transferred in-vaccuo to a laser scribe module. For particular embodiments where the first mask material layer 402A is hygroscopic, in-vaccuo transfer is advantageous. The spin and dispense parameters are a matter of choice depending on the material, substrate topography, and desired first mask material layer thickness. The bake temperature and time may be selected to avoid excessive crosslinking which renders removal difficult. Exemplary drying temperatures range from 60° C. to 150° C., depending on the material.

In the exemplary embodiment where the first mask material layer 402A is spin-coated (as illustrated in FIG. 2), the second mask material layer 402B may also spin-coated or dry film laminated (at operation 210). For spin-coat embodiments, the spin and dispense parameters are again a matter of choice depending on the material, substrate topography and desired thickness of the second mask material layer 402B (as a function of etch resistance, etc.). If spin-coated, the second mask material layer 402B may be dried with a bake temperature and bake time which will avoid excessive crosslinking of the first mask material layer 402A. Exemplary drying temperatures range from 60° C. to 150° C., depending on the material. Operation 220 then completes the masking method 200 with the substrate unloaded for subsequent scribing or transferred in-vaccuo to a laser scribe apparatus of an integrated platform.

Figure 4B:
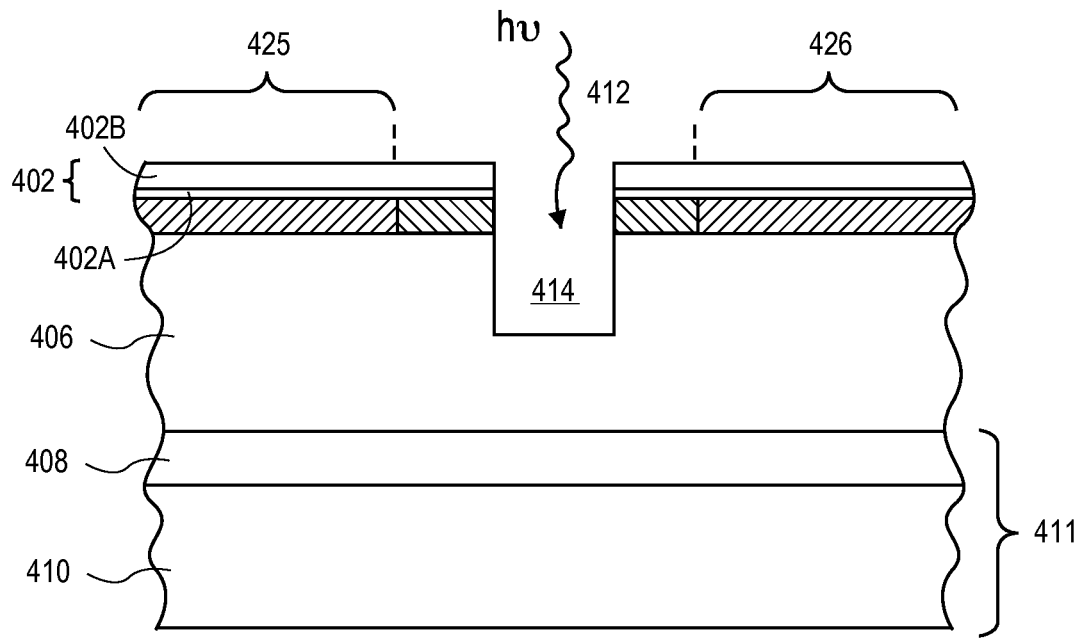
FIG. 4B illustrates a cross-sectional view of a semiconductor substrate including a plurality of ICs corresponding to operation 103 of the dicing methods illustrated in FIGS. 1A and 1B, in accordance with an embodiment of the present invention.

Returning now to operation 103 of the method 101, and corresponding FIG. 4B, the multi-layered mask 402 is patterned by ablation with a laser scribing process forming trenches 412, extending the subsurface thin film device layers, and exposing regions of the substrate 406 between the ICs 425, 426. As such, the laser scribing process is used to ablate the thin film material of the streets 427 originally formed between the ICs 425, 426. In accordance with an embodiment of the present invention, patterning the laser light absorbing multi-layered mask 402 with the laser-based scribing process includes forming trenches 414 partially into the regions of the substrate 406 between the ICs 425, 426, as depicted in FIG. 4B.

In the exemplary embodiment illustrated in FIG. 5, the laser scribing depth $D_L$ is approximately in the range of 5 μms to 50 μms deep, advantageously in the range of 10 μms to 20 μms deep, depending on the thickness $T_F$ of the passivation 511 and subsurface thin film device layers and thickness $T_{max}$ of the mask 402A.

In an embodiment, the mask 402 is patterned with a laser having a pulse width (duration) in the femtosecond range (i.e., $10^{-15}$ seconds), referred to herein as a femtosecond laser. Laser parameters selection, such as pulse width, may be critical to developing a successful laser scribing and dicing process that minimizes chipping, microcracks and delamination in order to achieve clean laser scribe cuts. A laser frequency in the femtosecond range advantageously mitigates heat damage issues relative to lasers with longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond-source. With nanosecond or picosecond laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately of 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

Parameters for a femtosecond laser-based process may be selected to have substantially the same ablation characteristics for the inorganic and organic dielectrics, metals, and semiconductors. For example, the absorptivity/absorptance of silicon dioxide is nonlinear and may be brought more in-line with that of organic dielectrics, semiconductors and metals. In one embodiment, a high intensity and short pulse width femtosecond-based laser process is used to ablate a stack of thin film layers including a silicon dioxide layer and one or more of an organic dielectric, a semiconductor, or a metal. In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds. In one embodiment, the pulse width is approximately in the range of 50 femtoseconds to 400 femtoseconds.

In certain embodiments, the laser emission spans any combination of the visible spectrum, the ultra-violet (UV), and/or infra-red (IR) spectrums for a broad or narrow band optical emission spectrum. Even for femtosecond laser ablation, certain wavelengths may provide better performance than others. For example, in one embodiment, a femtosecond-based laser process having a wavelength closer to (e.g., green band), or in, the UV range provides a cleaner ablation process than a femtosecond-based laser process having a wavelength closer to or in the IR range. In a specific embodiment, a femtosecond laser suitable for semiconductor substrate or substrate scribing is based on a laser having a wavelength of approximately less than or equal to 540 nanometers, although preferably in the range of 540 nanometers to 250 nanometers. In another embodiment, the laser has a wavelength of approximately less than or equal to 1600 nanometers. In a particular embodiment, pulse widths are less than or equal to 500 femtoseconds. In another embodiment, pulse widths are less than or equal to 600 femtoseconds. However, with some laser light absorbing water-soluble masks, a less expensive and more powerful infrared femtosecond laser may be employed rather than the more expensive more complicated second harmonic femtosecond lasers at 500-550 nm regime which only have 40-60% laser power of the infrared laser versions. In still other embodiments, dual laser wavelengths (e.g., a combination of an IR laser and a UV laser) are used.

In one embodiment, the laser and associated optical pathway provide a focal spot at the work surface approximately in the range of 3 μm to 15 μm, though advantageously in the range of 5 μm to 10 μm. The spatial beam profile at the work surface may be a single mode (Gaussian) or have a beam shaped top-hat profile. In an embodiment, the laser source has a pulse repetition rate approximately in the range of 300 kHz to 10 MHz, although preferably approximately in the range of 500 kHz to 5 MHz. In an embodiment, the laser source delivers pulse energy at the work surface approximately in the range of 0.5 μJ to 100 μJ, although preferably approximately in the range of 1 μJ to 5 μJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but is advantageously no more than two passes. The laser may be applied either in a train of single pulses at a given pulse repetition rate or a train of pulse bursts. In an embodiment, the kerf width of the laser beam generated is approximately in the range of 2 μm to 15 μm, although in silicon substrate scribing/dicing preferably approximately in the range of 6 μm to 10 μm, as measured at a device/silicon interface.

Figure 4C:
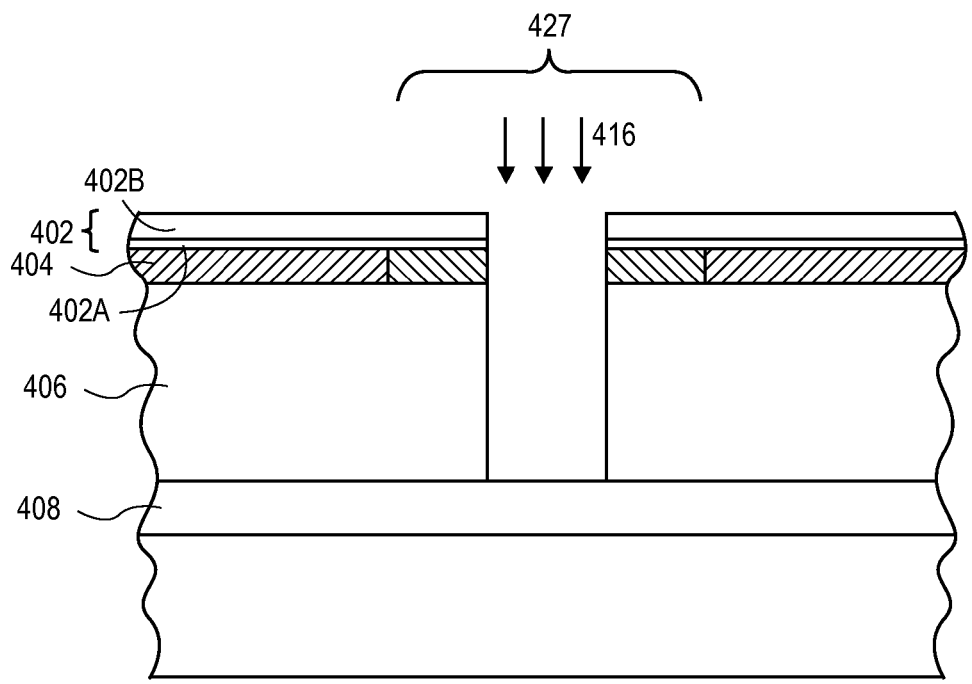
FIG. 4C illustrates a cross-sectional view of a semiconductor substrate including a plurality of ICs corresponding to operation 105 of the dicing method illustrated in FIG. 1A, in accordance with an embodiment of the present invention.
Figure 4D:
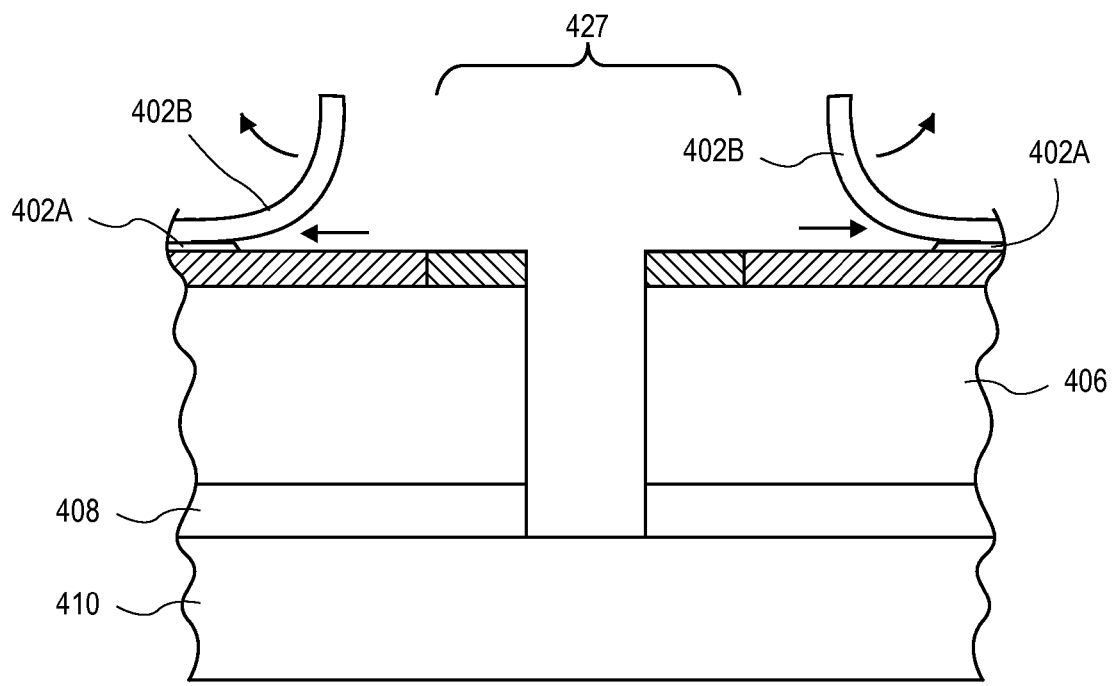
FIG. 4D illustrates a cross-sectional view of a semiconductor substrate including a plurality of ICs corresponding to operation 107 of the dicing methods illustrated in FIGS. 1A and 1B, in accordance with an embodiment of the present invention.

Returning to FIGS. 1A, 1B, and 4C, the substrate 406 is etched through the trenches 412 in the patterned mask 402 to singulate the ICs 425, 426. In accordance with an embodiment of the present invention, etching the substrate 406 includes etching the trenches 412 formed with the femtosecond-based laser scribing process to ultimately etch entirely through substrate 406, as depicted in FIG. 4C.

In an embodiment, etching the substrate 406 includes using an anisotropic plasma etching process 416. In one embodiment, a through substrate etch process is used with the mask 402A (and any potential overcoat) from plasma exposure for the entire duration of plasma etch. A high-density plasma source operating at high powers may be used for the plasma etching operation 105. Exemplary powers range between 3 kW and 6 kW, or more to achieve an etch rate of the substrate 406 that is greater than 25 μms per minute.

In an exemplary embodiment, a deep anisotropic silicon etch (e.g., a through silicon via etch) is used to etch a single crystalline silicon substrate or substrate 406 at an etch rate greater than approximately 40% of conventional silicon etch rates while maintaining essentially precise profile control and virtually scallop-free sidewalls. Effects of the high power on the multi-layered mask (particularly the first mask material layer 402A) are controlled through application of cooling power via an electrostatic chuck (ESC) chilled to −10° C. to −15° C. to maintain the mask material layer 402A at a temperature below 100° C. and preferably between 70° C. and 80° C. throughout the duration of the plasma etch process. At such temperatures, solubility of the mask material 402A may be advantageously maintained.

In a specific embodiment, the plasma etch entails a plurality of protective polymer deposition cycles interleaved over time with a plurality of etch cycles. The deposition:etch duty cycle may vary with the exemplary duty cycle being approximately 1:1. For example, the etch process may have a deposition cycle with a duration of 250 ms-750 ms and an etch cycle of 250 ms-750 ms. Between the deposition and etch cycles, an etching process chemistry, employing for example $SF_6$ for the exemplary silicon etch embodiment, is alternated with a deposition process chemistry, employing a polymerizing $C_xF_y$ gas such as, but not limited to, $CF_4$, $C_4F_6$ or $C_4F_8$. Process pressures may further be alternated between etch and deposition cycles to favor each in the particular cycle, as known in the art.

The hybrid laser ablation-plasma etch singulation method 101 is then completed at operation 107 with removal of the mask 402. In the exemplary embodiment illustrated in FIG. 4D, the mask removal operation 107 entails dissolving the first mask material layer 402A selectively to the ICs 425, 426 (e.g., selectively to passivation layer 511, bump 512) as well as selectively to the second mask material layer 402B. The second mask material layer 402B is thereby lifted-off. In one embodiment where the first mask material layer 402A is water soluble, the water soluble mask layer is washed off with a pressurized jet of de-ionized water or through submergence of the substrate in an ambient or heated water bath. As further illustrated in FIG. 4D, either of the singulation process or mask removal process may further include patterning the die attach film 408, exposing the top portion of the backing tape 410.

Figure 6:
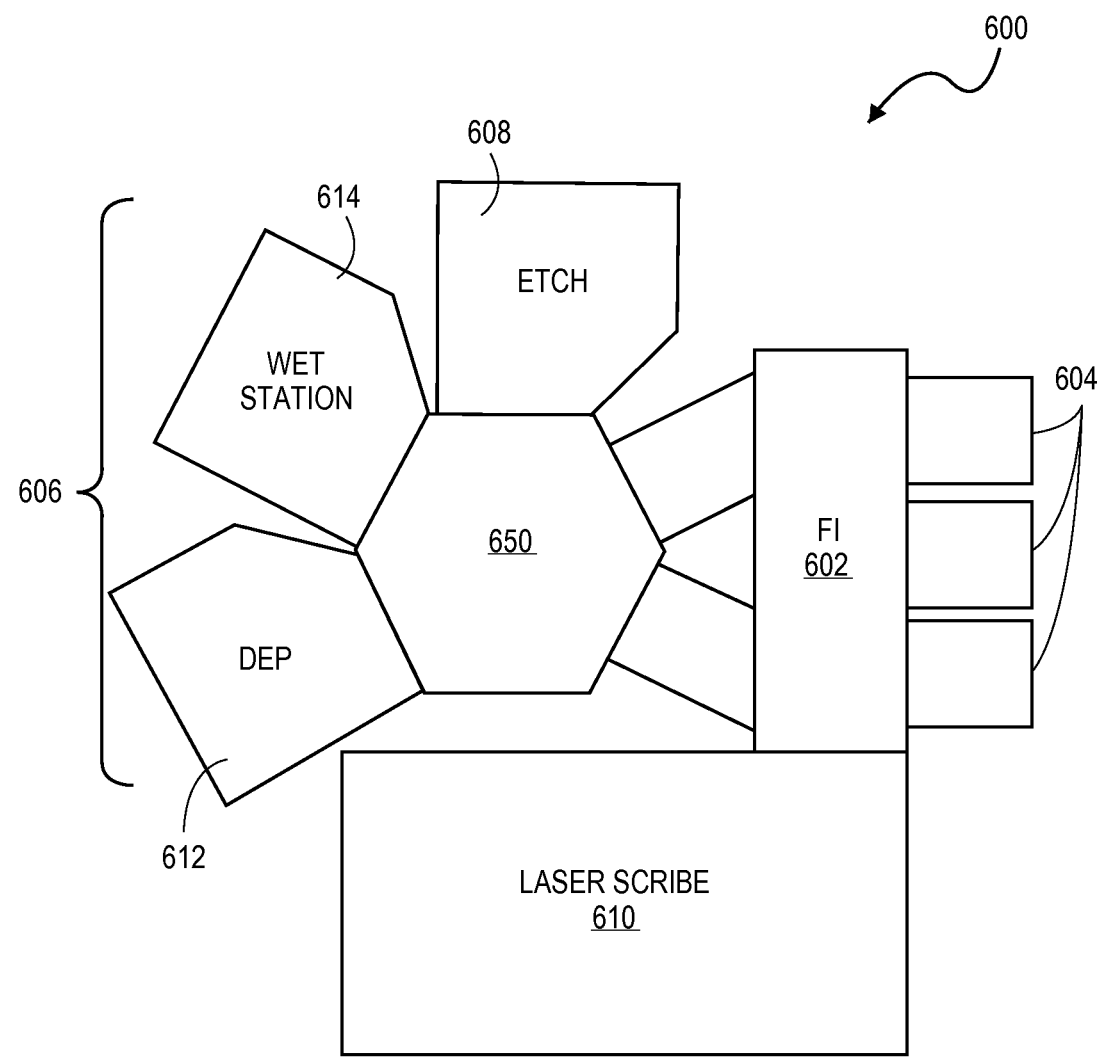
FIG. 6 illustrates a block diagram of a tool layout for laser and plasma dicing of substrates with an integrated deposition module for in-situ application of a multi-layered mask, in accordance with an embodiment of the present invention.

A single integrated platform 600 may be configured to perform many or all of the operations in the hybrid laser ablation-plasma etch singulation processes 101 of FIG. 1A and 201 of FIG. 1B. For example, FIG. 6 illustrates a block diagram of a cluster tool 606 coupled with laser scribe apparatus 610 for laser and plasma dicing of substrates, in accordance with an embodiment of the present invention. Referring to FIG. 6, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either the cluster tool 606 or laser scribe apparatus 610, or both.

A laser scribe apparatus 610 is also coupled to the FI 602. In an embodiment, the laser scribe apparatus 610 includes a femtosecond laser. The femtosecond laser is configured to perform the laser ablation portion of the hybrid laser and etch singulation processes 101 of FIG. 1A and 201 of FIG. 1B. In one embodiment, a moveable stage is also included in laser scribe apparatus 610, the moveable stage configured for moving a substrate or substrate (or a carrier thereof) relative to the femtosecond-based laser. In a specific embodiment, the femtosecond laser is also moveable.

The cluster tool 606 includes one or more plasma etch chambers 608 coupled to the FI by a robotic transfer chamber 650 housing a robotic arm for in-vaccuo transfer of substrates. The plasma etch chambers 608 is suitable for performing a plasma etch portion of the hybrid laser and etch singulation processes 101 of FIG. 1A and 201 of FIG. 1B. In one exemplary embodiment, the plasma etch chamber 608 is further coupled to an $SF_6$ gas source and at least one of a $CF_4$, $C_4F_8$, and $C_4F_6$ source. In a specific embodiment, the one or more plasma etch chambers 608 is an Applied Centura® Silvia™ Etch system, available from Applied Materials of Sunnyvale, Calif., USA, although other suitable etch systems are also available commercially. In an embodiment, more than one etch chamber 608 is included in the cluster tool 606 portion of integrated platform 600 to enable high manufacturing throughput of the singulation or dicing process.

The cluster tool 606 may include other chambers suitable for performing functions in the hybrid laser ablation-plasma etch singulation processes 101 of FIG. 1A and 201 of FIG. 1B. In the exemplary embodiment illustrated in FIG. 6, the cluster tool 606 includes both a mask formation module 612 and a wet station 614, though either may be provided in absence of the other. The mask formation module 612 may be a spin coating module. As a spin coating module, a rotatable chuck is configured to clamp by vacuum, or otherwise, a thinned substrate mounted on a carrier such as backing tape mounted on a frame. In further embodiments, the spin coating module is fluidly coupled to an aqueous solution source.

Embodiments of the wet station 614 are to dissolve the mask material layer 402A after plasma etching the substrate. The wet station 614 may include for example a pressurized spray jet to dispense water other solvent.

Figure 7:
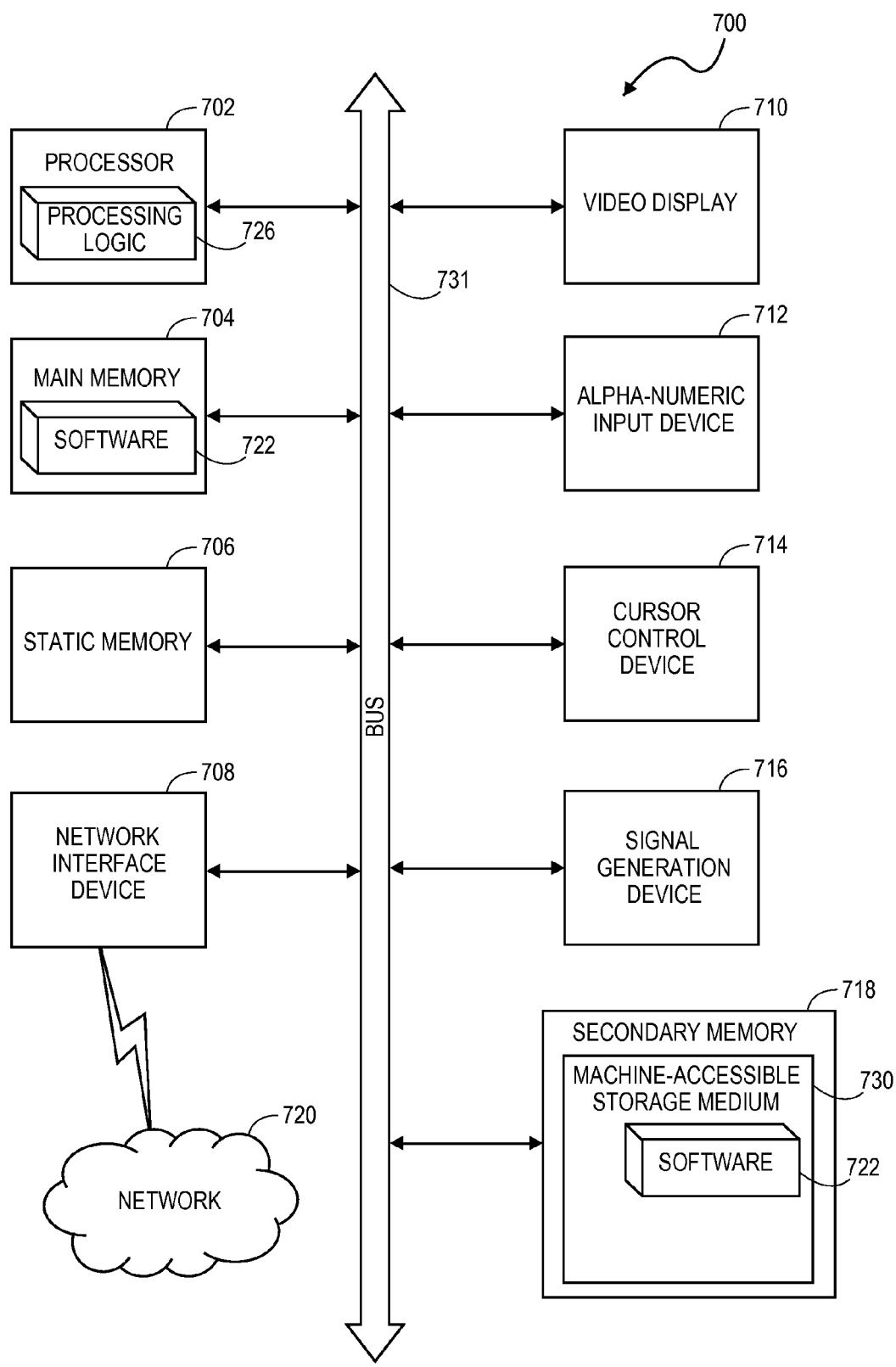
FIG. 7 illustrates a block diagram of an exemplary computer system which controls automated performance of one or more operation in the masking, laser scribing, plasma dicing methods described herein, in accordance with an embodiment of the present invention.

FIG. 7 illustrates a computer system 700 within which a set of instructions, for causing the machine to execute one or more of the scribing methods discussed herein may be executed, for example to analyze a reflected light from a tag to identify at least one micromachine artifact. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 731.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 730 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

The machine-accessible storage medium 730 may also be used to store pattern recognition algorithms, artifact shape data, artifact positional data, or particle sparkle data. While the machine-accessible storage medium 730 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A method of dicing a substrate comprising a plurality of integrated circuits (ICs) on a front side of the substrate opposite a back side of the substrate, the method comprising:

forming a multi-layered mask including a non-photodefinable laser light absorbing layer over the substrate covering and protecting the ICs on the front side of the substrate;

patterning the multi-layered mask with a laser scribing process to provide a patterned multi-layered mask with gaps, exposing regions of the substrate between the ICs, the laser scribing process performed from the front side of the substrate;

plasma etching the substrate through the gaps in the patterned multi-layered mask to singulate the ICs, the plasma etching performed from the front side of the substrate; and removing the mask with an aqueous solution.

2. The method of claim 1, wherein forming the multi-layered mask further comprises depositing a water-soluble polymeric precursor over the ICs, forming a water-soluble layer over the ICs.

3. The method of claim 2, wherein removing the mask comprises dissolving the water-soluble layer and lifting the non-photodefinable laser light absorbing layer off the top surface of the ICs.

4. The method of claim 3, wherein dissolving the water-soluble layer further comprises exposing the multi-layered mask to water in which the non-photodefinable laser light absorbing layer is substantially insoluble.

5. The method of claim 4, wherein the forming the multi-layered mask comprises applying at least one of: poly(vinyl alcohol), poly(acrylic acid), poly(methacrylic acid), poly(acrylamide), or poly(ethylene oxide) as the water-soluble layer in contact with a top surface of the ICs.

6. The method of claim 5, wherein the non-photodefinable laser light absorbing layer comprises at least one of Poly (methyl methacrylate), Poly(methyl acrylate), and Beta-acryloyloxy propionic acid.

7. The method of claim 1, wherein the non-photodefinable laser light absorbing layer comprises at least one of polystyrene-co-polyacrylonitrile copolymer, or an epoxy-containing polymer (e.g., cyanate ester-epoxy, epoxy-phenolic).

8. The method of claim 1, wherein patterning the mask further comprises direct writing the pattern with a femtosecond laser.

9. A semiconductor wafer comprising:
a plurality of integrated circuits (ICs) disposed on a substrate; and
a multi-layered mask including a water-soluble base layer and a non-photodefinable laser light absorbing overcoat disposed over thin film layers of the ICs, the mask ablated in regions disposed over streets between adjacent ICs, wherein the multi-layered mask comprises at least one of: poly(vinyl alcohol), poly(acrylic acid), poly(methacrylic acid), poly(acrylamide), or poly(ethylene oxide) as the water-soluble base layer in contact with a top surface of the ICs, and wherein the non-photodefinable laser light absorbing overcoat comprises at least one of Poly(methyl methacrylate), Poly (methyl acrylate), and Beta-acryloyloxy propionic acid.

10. A semiconductor wafer comprising:
a plurality of integrated circuits (ICs) disposed on a substrate; and
a multi-layered mask including a water-soluble base layer and a non-photodefinable laser light absorbing overcoat disposed over thin film layers of the ICs, the mask ablated in regions disposed over streets between adjacent ICs, wherein the non-photodefinable laser light absorbing overcoat comprises at least one of polystyrene-co-polyacrylonitrile copolymer, or an epoxy-containing polymer (e.g., cyanate ester-epoxy, epoxy-phenolic), and wherein the multi-layered mask comprises at least one of: poly(vinyl alcohol), poly(acrylic acid), poly(methacrylic acid), poly(acrylamide), or poly(ethylene oxide) as the water-soluble base layer in contact with a top surface of the ICs.

\* \* \* \* \*